United States Patent
Saita

(10) Patent No.: US 8,334,639 B2
(45) Date of Patent: Dec. 18, 2012

(54) PACKAGE FOR ELECTRONIC COMPONENT, PIEZOELECTRIC DEVICE AND MANUFACTURING METHOD THEREOF

(75) Inventor: Hiroyasu Saita, Atsugi (JP)

(73) Assignee: Seiko Epson Corporation (JP)

( * ) Notice: Subject to any disclaimer, the term of this patent is extended or adjusted under 35 U.S.C. 154(b) by 522 days.

(21) Appl. No.: 12/574,859

(22) Filed: Oct. 7, 2009

(65) Prior Publication Data
US 2010/0102678 A1    Apr. 29, 2010

(30) Foreign Application Priority Data

Oct. 24, 2008  (JP) .................. 2008-274040
May 19, 2009  (JP) .................. 2009-120593

(51) Int. Cl.
*H01L 41/08* (2006.01)
(52) U.S. Cl. .................. 310/344; 310/340; 310/370
(58) Field of Classification Search .................. 310/340, 310/344
See application file for complete search history.

(56) References Cited

U.S. PATENT DOCUMENTS

| | | | | |
|---|---|---|---|---|
| 6,960,870 B2* | 11/2005 | Kikushima et al. | ........... | 310/344 |
| 6,976,295 B2* | 12/2005 | Kikushima et al. | ........... | 29/25.35 |
| 7,605,521 B2* | 10/2009 | Kuwahara | ........... | 310/344 |
| 7,859,172 B2* | 12/2010 | Ishikawa et al. | ........... | 310/348 |
| 7,876,029 B2* | 1/2011 | Matsugi | ........... | 310/348 |
| 8,058,778 B2* | 11/2011 | Numata et al. | ........... | 310/344 |
| 2006/0255691 A1 | 11/2006 | Kuroda et al. | | |

FOREIGN PATENT DOCUMENTS

| | | |
|---|---|---|
| CN | 101199113 A | 6/2008 |
| JP | 09-193967 | 7/1997 |
| JP | 2000-269775 | 9/2000 |
| JP | 2004-254238 | 9/2004 |
| JP | 2007-180924 | 7/2007 |

* cited by examiner

*Primary Examiner* — J. San Martin
(74) *Attorney, Agent, or Firm* — Harness, Dickey & Pierce, P.L.C.

(57) ABSTRACT

A package for an electronic component includes a first substrate and a second substrate. In the package, an interior space capable of housing the electronic component is formed between the first substrate and the second substrate, a sealing hole communicating with the interior space and an exterior is formed in at least one of the first substrate and the second substrate, the interior space can be airtightly sealed by melting a solid sealant provided in the sealing hole, and an interior wall of the sealing hole has a curved surface extending in directions of penetration and inner periphery of the sealing hole.

5 Claims, 9 Drawing Sheets

PACKAGE FOR ELECTRONIC COMPONENT, PIEZOELECTRIC DEVICE AND MANUFACTURING METHOD THEREOF

BACKGROUND

1. Technical Field

The present invention relates to a package for an electronic component including an interior space in which the electronic component is airtightly sealed, a piezoelectric device airtightly sealing a piezoelectric resonator element serving as the electronic component, and a manufacturing method of the piezoelectric device.

2. Related Art

Piezoelectric devices, such as crystal resonators, have been used in various information and communication devices, office automation (OA) equipment, and electronic apparatuses, such as consumer-electronics devices. Especially in recent years, significant progress in improving performance as well as downsizing and thinning of the electronic apparatuses and the like has been made. In order to respond to demands for smaller and thinner devices, surface-mounted piezoelectric devices suitably mounted on circuit boards have been widely used. In general, surface-mounted piezoelectric devices have a structure in which a piezoelectric resonator element is bonded in a package made of an insulating material, such as ceramic, and a lid is bonded on the package so as to seal the piezoelectric resonator element in a cavity formed by the package and the lid. However, the related-art package structure, in which a package and a lid are bonded with low-melting point glass or by seam welding, may lower or deteriorate frequency characteristics of piezoelectric resonator elements due to outer gas, high heat or the like generated in the seam welding.

For solving such problems, a piezoelectric device is proposed that includes a package composed of a first substrate and a second substrate and houses a piezoelectric resonator element serving as an electronic component in an interior space between two substrates. JP-A-2000-269775 is a first example of related art introducing a quartz resonator element serving as the piezoelectric device. In the first example, a resonator element substrate (quartz crystal element) in which a crystal resonator element integrally formed with a frame is provided between a first substrate (base substrate) and a second substrate (lid substrate) made of quartz crystal, glass or the like, and they are bonded to each other by direct bonding (surface activated bonding) so as to house the crystal resonator element in an interior space between the first substrate and the second substrate. The surface activated bonding is a bonding method in which bonding regions that are a corresponding surface for bonding of quartz crystal or glass mainly composed of silicon (Si) are mirror polished, brought into contact, and pressurized so as to directly bond the bonding materials by silicon bonds (interatomic bonds) of the contact surface. The bonding materials can be bonded substantially without heating.

JP-A-2004-254238 is a second example of related art introducing a method for manufacturing a piezoelectric device by using anodic bonding, which is a directly bonding method different from the surface activated bonding. In the second example, the piezoelectric device is manufactured as follows. A lid substrate and a base substrate are directly bonded with the resonator element substrate, in which a piezoelectric resonator element is formed, interposed therebetween. In a vacuum chamber, a sphere sealant made of metal or the like that fuses is provided in a sealing hole (through hole) formed in either one of the lid substrate and the base substrate. The sealant is melted and solidified so as to fill the sealing hole. Accordingly, the piezoelectric resonator element is airtightly sealed in an interior space formed by the lid substrate and the base substrate.

JP-A-2007-180924 is a third example of related art. In the piezoelectric device shown in the third example, however, the interior wall of the sealing hole has a linear shape toward a direction of penetration of the sealing hole. Therefore, when the sphere sealant is provided in the sealing hole, the portion contacting the interior wall of the sealing hole with the sealant is very small. When the sealant is melted for sealing the sealing hole, heat is not efficiently conducted to the sealant. Therefore, it is hard to promote melting of the sealant, and also the melted sealant is hard to wet and cover the interior surface of the sealing hole. Accordingly, it is hard to ensure airtight properties of the sealing, and reliability of the piezoelectric device may be decreased by malfunction of the piezoelectric resonator element due to sealing defects and influence of external factors.

SUMMARY

The invention intends to solve at least part of the above problem, and can be realized by the following aspects.

According to a first aspect of the invention, a package for an electronic component includes a first substrate and a second substrate. In the package, an interior space capable of housing the electronic component is formed between the first substrate and the second substrate, a sealing hole communicating with the interior space and an exterior is formed in at least one of the first substrate and the second substrate, the interior space can be airtightly sealed by melting a solid sealant provided in the sealing hole, and an interior wall of the sealing hole has a curved surface extending in directions of penetration and inner periphery of the sealing hole.

When the electronic component is sealed by the package for an electronic component, the sphere sealant made of metal is often provided in the sealing hole and is melted so as to cover the sealing hole. According to the structure above, the interior wall of the sealing hole formed in at least one of the first substrate and the second substrate includes a curved surface extending in the directions of penetration and inner periphery of the sealing hole. Therefore, when the solid sealant is provided in the sealing hole, the portion where the surface of the sphere sealant contacts with or closes to the interior wall of the sealant can be widely ensured. Accordingly, when the sealant is melted for sealing the sealing hole, heat can be well conducted to the sealant through the interior wall surface of the sealing hole. Further, since the melted sealant easily wets and covers the interior wall surface of the sealing hole, sealing defects are suppressed. As a result, a piezoelectric device having stable oscillation characteristics and high reliability can be provided.

According to a second aspect of the invention, a package for an electronic component includes a first substrate and a second substrate. In the package, an interior space capable of housing the electronic component is formed between the first substrate and the second substrate, a sealing hole communicating with the interior space and an exterior is formed in at least one of the first substrate and the second substrate, the interior space can be airtightly sealed by providing a sealant in the sealing hole, an interior wall of the sealing hole has a curved surface extending in directions of penetration and inner periphery of the sealing hole. In the package, an area of the opening at an exterior side of the sealing hole is larger than an area of the opening at an interior space side if the sealing hole is plan-viewed from the exterior toward the interior space, and a center of the opening at the exterior side is different from a center of the opening at the interior space side.

According to the structure, when the sphere and solid sealant is provided in the sealing hole, the opening communicating with the opening at the exterior side and the opening at the interior space side is off-center from the center of the opening at the exterior side. Therefore, a space can be easily ensured between the interior wall of the sealing hole and the sealant, so that the vacuuming time in a hole sealing step, in which the electronic component is airtightly sealed in the interior space, is shortened and manufacturing efficiency can be improved.

According to a third aspect of the invention, a piezoelectric device includes a piezoelectric resonator element, a first substrate, and a second substrate. In the device, the first substrate and the second substrate form an interior space capable of housing the piezoelectric resonator element is formed between the first substrate and the second substrate, a sealing hole communicating with the interior space and an exterior is formed in at least one of the first substrate and the second substrate, and a solid sealant provided in the sealing hole is melted and solidified so as to airtightly seal the interior space. In the device, an interior wall of the sealing hole has a curved surface extending in directions of penetration and inner periphery of the sealing hole, and an area of the opening at an exterior side of the sealing hole is larger than an area of the opening at an interior space side if the sealing hole is plan-viewed from the exterior toward the interior space.

According to the structure, the opening at the exterior side to which the solid and sphere sealant before melted is provided is formed in accordance with the size of the sealant. Therefore, in the sealing step, the sealing hole can be stably sealed by the sealant.

In the piezoelectric device, the opening of the sealing hole at the interior space side may be an oval if the opening is plan-viewed.

According to the structure, when the sphere and solid sealant before melted is provided in the sealing hole, an opening that is the middle opening communicating with the opening at exterior side and the opening at the interior space side includes a space relatively easily ensured between the interior wall of the sealing hole and the sealant. Therefore, the vacuuming time in the hole sealing step is further shortened.

In the piezoelectric device, a center of the opening at the exterior side of the sealing hole may be different from a center of the opening at the interior space side.

According to the structure, when the sphere sealant before melted is provided in the sealing hole, the opening that is the middle opening communicating with the opening at exterior side and the opening at the interior space side is off-center from the center of the opening at the exterior side. Therefore, a space can be easily ensured between the interior wall of the sealing hole and the sealant, so that the vacuuming time in the hole sealing step is shortened. With this structure, the sealant provided from the exterior side, in which the opening is widely formed, can be prevented from dropping to the interior space side, and the opening widely formed at the interior space side of the sealing hole allows the vacuuming to be easily performed. As a result, the vacuuming time is shortened and manufacturing efficiency can be improved.

According to a fourth aspect of the invention, a method for manufacturing a piezoelectric device including a piezoelectric resonator element, a first substrate and a second substrate that form an interior space housing the piezoelectric resonator between the first substrate and the second substrate, a sealing hole communicating with the interior space and an exterior being formed in at least one of the first substrate and the second substrate, an interior wall of the sealing hole having a curved surface extending in directions of penetration and inner periphery of the sealing hole, and an area of the opening at an exterior side of the sealing hole being larger than an area of the opening at an interior space side of the sealing hole if the sealing hole is plan-viewed from the exterior toward the interior space, the method includes forming the sealing hole in the substrate by sandblasting, forming a metal layer on the interior wall of the sealing hole, providing the piezoelectric resonator element between the first substrate and the second substrate, bonding the first substrate and the second substrate, providing a solid sealant in the sealing hole, melting the sealant, and hardening the melted sealant so as to airtightly seal the interior space.

Unlike etching method, such as wet etching or dry etching, the sandblasting does not rely on etch anisotropy for specific crystal orientation of the workpiece, and the workpiece can be drilled to a predetermined shape. Thus, the sandblasting is suitable for forming a sealing hole having a curved surface extending in directions of penetration and inner periphery of the sealing hole as the structure above. In addition, by forming the metal film on the wall surface of the sealing hole, the melted sealant made of metal wets and covers an electrode film in the hole sealing step. Therefore, hole can be firmly sealed. The solid sealant provided in the sealing hole is melted and hardened so as to firmly seal the sealing hole. As a result, the piezoelectric device having stable oscillation characteristics and high reliability can be manufactured.

In the method for manufacturing a piezoelectric device, forming the sealing hole may include drilling the substrate from one surface of the substrate in a thickness direction of the substrate by the sandblasting and drilling the substrate from another surface of the substrate in the thickness direction of the substrate by the sandblasting.

According to the structure, two concaves formed by drilling the substrate from both surfaces, the surface at the exterior side and the surface at the interior space side, are penetrated so as to form the sealing hole serving as a through hole. Accordingly, comparing with the sealing hole formed by drilling from either one surface of the substrate, the opening at the side where the drill is started can be prevented from being enlarged, and the sealing hole can be formed in accordance with the size of the sealant. As a result, the hole can be firmly sealed with the sealant, and the piezoelectric device having stable oscillation characteristics can be manufactured.

In the piezoelectric device, a center of the opening at the exterior side may be different from a center of the opening at the interior space side.

According to the structure, when the sphere and solid sealant is provided in the sealing hole, the opening communicating with the opening at the exterior side and the opening at the interior space side is off-center from the center of the opening at the exterior side. Therefore, a space can be easily ensured between the interior wall of the sealing hole and the sealant, so that the vacuuming time in the hole sealing step, in which the electronic component is airtightly sealed in the interior space, is shortened and manufacturing efficiency of the piezoelectric device can be improved.

BRIEF DESCRIPTION OF THE DRAWINGS

The invention will be described with reference to the accompanying drawings, wherein like numbers reference like elements.

FIG. 2A is a plan view, FIG. 2B is a sectional view taken along line A-A of FIG. 2A, and FIG. 2C is a bottom view of the resonator element substrate.

FIG. 4A is a partial enlarged plan view, and FIG. 4B is a sectional view taken along line C-C of FIG. 4A.

FIG. 6A is a plan view, and FIG. 6B is a sectional view taken along line E-E of FIG. 6A.

FIG. 7A is a plan view, and FIG. 7B is a sectional view taken along line F-F of FIG. 7A.

FIG. 8A is a plan view, and FIG. 8B is a sectional view taken along line G-G of FIG. 8A.

DESCRIPTION OF EXEMPLARY EMBODIMENT

One embodiment of the invention will be described with reference to the accompanying drawings.

First Embodiment

Figure 1:
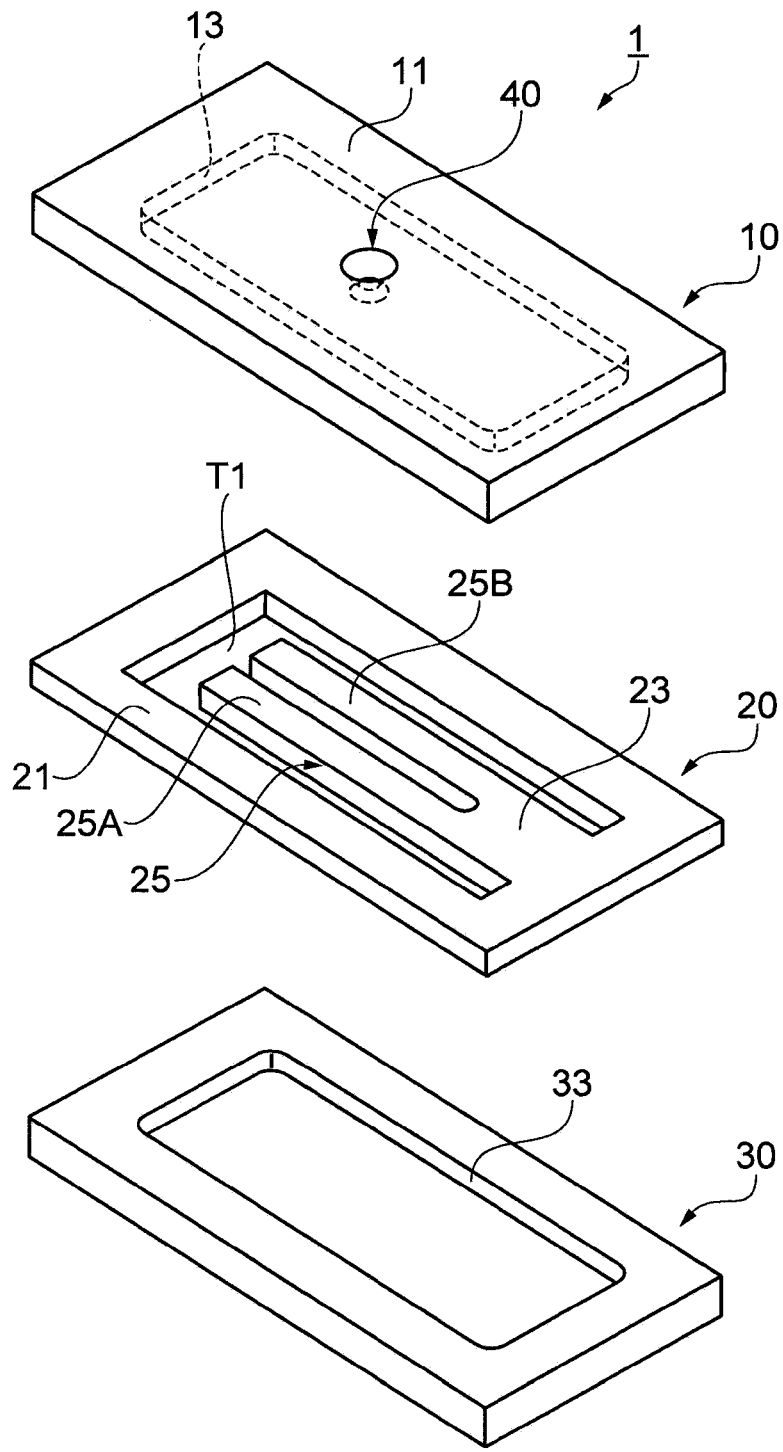
FIG. 1 is an exploded perspective view schematically showing a crystal resonator according to a first embodiment.
Figure 2A:
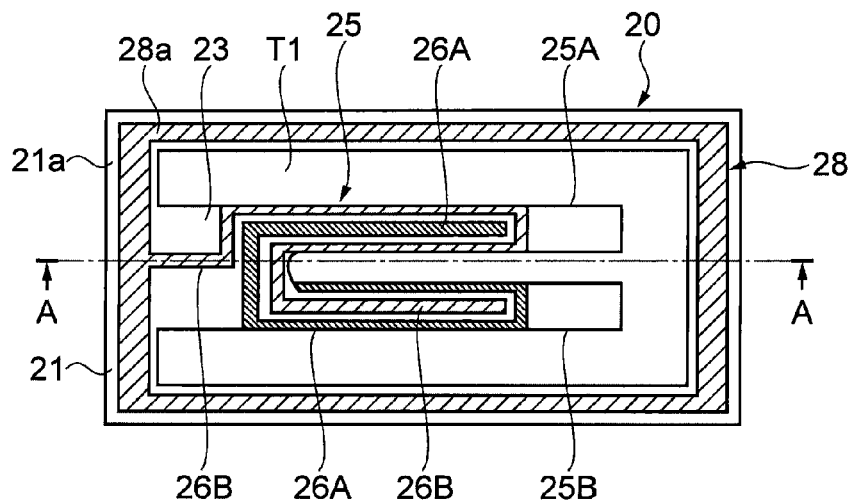
FIGS. 2A, 2B, and 2C are schematic views showing a resonator element substrate of the crystal resonator according to the first embodiment.
Figure 2B:
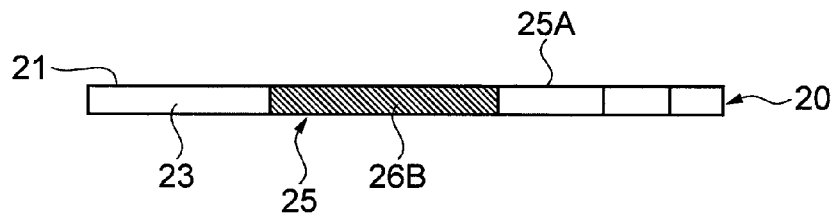
Figure 2C:
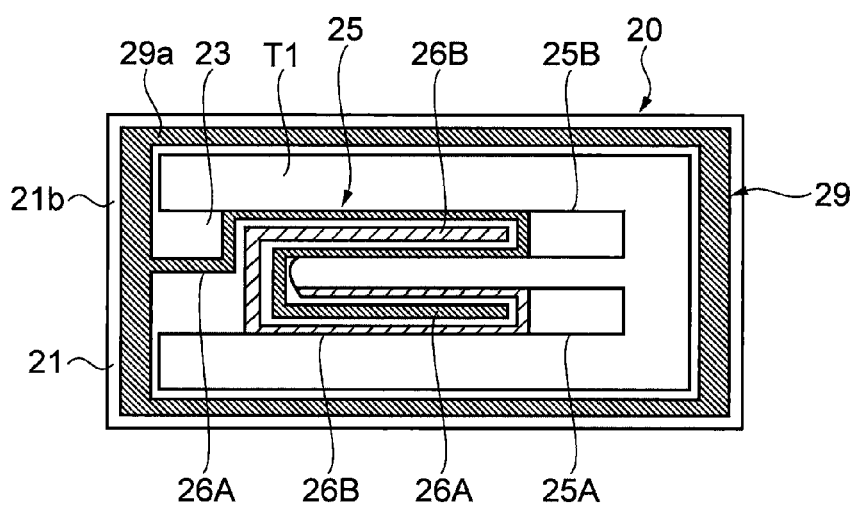
Figure 3:
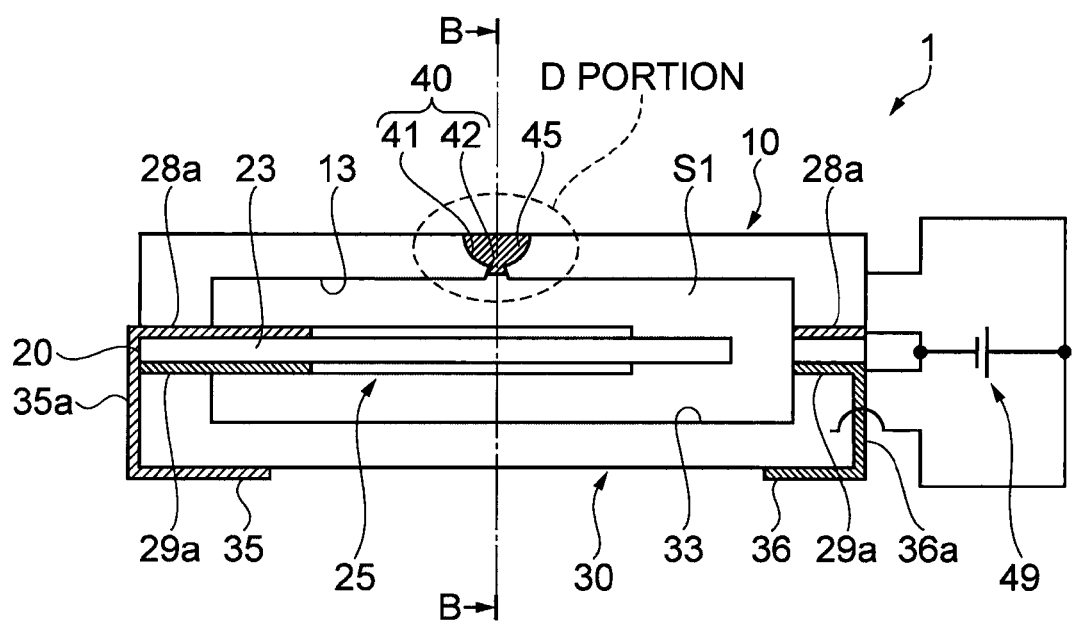
FIG. 3 is a sectional view taken along line A-A of FIG. 2A schematically showing a cross sectional structure of the crystal resonator and a state where anodic oxidation is performed.

FIGS. 1 to 3 show an embodiment in which a piezoelectric resonator serving as a piezoelectric device is realized as a crystal resonator. FIG. 1 is an exploded perspective view schematically showing the piezoelectric resonator. FIGS. 2A, 2B, and 2C are schematic views showing a resonator element substrate that a crystal resonator element serving as a piezoelectric resonator element is integrally formed with a frame. FIG. 2A is a plan view, FIG. 2B is a sectional view taken along line A-A of FIG. 2A, and FIG. 2C is a bottom view of the resonator element substrate. FIG. 3 is a sectional view schematically showing a cross-sectional structure of the crystal resonator and the state where anodic oxidation is performed. FIG. 3 also shows a sectional view of the crystal resonator shown in FIG. 1 taken along line of A-A of FIG. 2.

Referring to FIG. 1, a crystal resonator 1 is composed of a lid substrate 10 serving as a first substrate, a resonator element substrate 20, and a base substrate 30 serving as a second substrate. The resonator element substrate 20 is fixed with the lid substrate 10 and the base substrate 30 so as to cover an opening T1 communicating in a thickness direction of the resonator element substrate 20. The resonator element substrate 20 of the embodiment is made of quartz crystal. The lid substrate 10 and the base substrate 30 are made of glass, silicon, or alternatively, quartz crystal as the resonator element substrate 20.

The lid substrate 10 is at least big enough to cover the opening T1 of the resonator element substrate 20. In the embodiment, since the outline of the resonator element substrate 20 is a rectangle, the outline of the lid substrate 10 also is a rectangle. Likewise, the base substrate 30 is at least big enough to cover the opening T1 of the resonator element substrate 20. In the embodiment, since the outline of the resonator element substrate 20 is a rectangle, the outline of the base substrate 30 also is a rectangle.

A concave 13 is provided on a face of the lid substrate 10 to which the resonator element substrate 20 is bonded. Similarly, a concave 33 is provided on a face of the base substrate 30 to which the resonator element substrate 20 is bonded. The lid substrate 10 and the base substrate 30 are fixed so as to face the concaves 13 and 33 with the resonator element substrate 20 therebetween. Accordingly, the concaves 13 and 33 form an interior space S1 (refer to FIG. 3) together with the opening T1 that is a space inside the resonator element substrate 20. The interior space S1 houses a crystal resonator element 25 serving as an electronic component of the resonator element substrate 20.

The resonator element substrate 20 includes a frame 21 formed integrally with the crystal resonator element 25. The frame 21 forms the rectangle outline of the resonator element substrate 20. The crystal resonator element 25 includes a base 23 formed inside the frame 21 and resonating arms 25A and 25B extending in parallel from the base 23. In the embodiment, the resonator element substrate 20 can be formed by etching a thin quartz crystal plate using photolithography.

Here, the resonator element substrate 20 will be described in detail. In FIGS. 2A and 2C, the crystal resonator element 25 of the resonator element substrate 20 includes the base 23 and a pair of resonating arms 25A and 25B. The base 23 is integral with the inside of one end of the frame 21. The resonating arms 25A and 25B are divided into two and extend in parallel to the right direction in the drawing from the base 23 serving as a base end. That is, the crystal resonator element 25 is so-called a tuning fork type crystal resonator element whose shape is like a tuning fork.

As FIG. 2A shows, a first electrode 28 is provided on an upper end surface 21a of the frame 21 of the resonator element substrate 20. The first electrode 28 includes a first bonding electrode 28a laid out on the upper end surface 21a of the frame 21, and a first excitation electrode 26B provided on both side surfaces of the resonating arm 25A and the upper surface and the bottom surface of the resonating arm 25B. The first excitation electrode 26B is coupled to the first bonding electrode 28a through the base 23 of the crystal resonator element 25.

As FIG. 2C shows, a second electrode 29 is provided on a bottom end surface 21b of the frame 21 of the resonator element substrate 20. The second electrode 29 includes a second bonding electrode 29a laid out on the bottom end surface 21b of the frame 21, and a second excitation electrode 26A provided on both side surfaces of the resonating arm 25B and the upper surface and the bottom surface of the resonating arm 25A. The second excitation electrode 26A is coupled to the second bonding electrode 29a through the base 23 of the crystal resonator element 25.

These electrodes have structural features in the crystal resonator 1 of the embodiment as follows. Namely, the first bonding electrode 28a is used for anodically bonding the resonator element substrate 20 and the lid substrate 10. The second bonding electrode 29a is used for anodically bonding the resonator element substrate 20 and the base substrate 30. Further, the first excitation electrode 26B and the second excitation electrode 26A are used for driving the crystal resonator element 25. The first and the second bonding electrodes 28a and 29a and the first and the second excitation electrodes 26B and 26A are formed in the same manner as follows. A chrome (Cr) layer as a base is formed on a surface of the resonator element substrate 20 by sputtering, for example, and, a gold (Au) layer is laminated on the base. The resonator element substrate 20 is formed by etching a quartz crystal material using photolithography.

Further, on the portions corresponding to the first and the second bonding electrodes 28a and 29a, an aluminum (Al) layer, for example, is laminated as a metal coated layer for anodic oxidation. Instead of aluminum, for example, tungsten (W), nickel (Ni), titanium (Ti), or silicon (Si) may be used.

As FIG. 3 shows, the first bonding electrode 28a is coupled to a mounting electrode 35 provided on the bottom surface of the base substrate 30 through a side electrode 35a laid out on the side surface of the left in the drawing.

As an important structure in the crystal resonator 1, as FIG. 3 shows, a sealing hole 40 is provided in the vicinity of the center of the lid substrate 10 in the embodiment. The sealing hole 40 communicating with the interior space S1 and the exterior of the crystal resonator 1. The crystal resonator 1 shown in FIG. 3 shows the state where a sealant 45, described below, is provided for sealing the sealing hole 40.

FIG. 3 further shows the state where the lid substrate 10 and the base substrate 30 are anodically bonded to the resonator element substrate 20. That is, to the lid substrate 10 and the base substrate 30, a direct current voltage from a direct current power source 49 is applied while temperature below the softening points of the lid substrate 10 and the base substrate 30 is added thereto. The voltage is applied between one side (the lid substrate 10 and the base substrate 30) and the other side (the bonding electrodes 28a and 29a) such that the bonding electrodes 28a and 29a function as an anode. The bonding electrodes 28a and 29a serve as a bonding film for bonding the lid substrate 10 and the base substrate 30 to the resonator element substrate 20.

The lid substrate 10, the resonator element substrate 20, and the base substrate 30 are bonded as the following manner. First, ions move to the lid substrate 10 and the base substrate 30 both made of glass by the action of an applied direct current voltage, and the voltage is continuously applied to a gap between the lid substrate 10 and the bonding electrodes 28a as well as a gap between the base substrate 30 and the bonding electrode 29a, and a space charge layer formed in the vicinity of the gaps. Then, electrostatic attraction is generated between the lid substrate 10 and the bonding electrodes 28a as well between the base substrate 30 and the bonding electrode 29a so that they closely make contact with each other. It is considered that ions transferred from the glass substrates to each electrode by an intense electric field, and the ions form a covalent bond with atoms of the electrode at a boundary therebetween and bonding is performed. This step can be conducted in a reversible manner by utilizing a reverse voltage.

According to the action of the anodic bonding described above, the interior space S1 housing the crystal resonator element 25 is airtightly sealed by the lid substrate 10 and the base substrate 30 in the crystal resonator 1 bonded by the lid substrate 10 and the base substrate 30 with the resonator element substrate 20 therebetween.

Sealing Hole

Figure 4A:
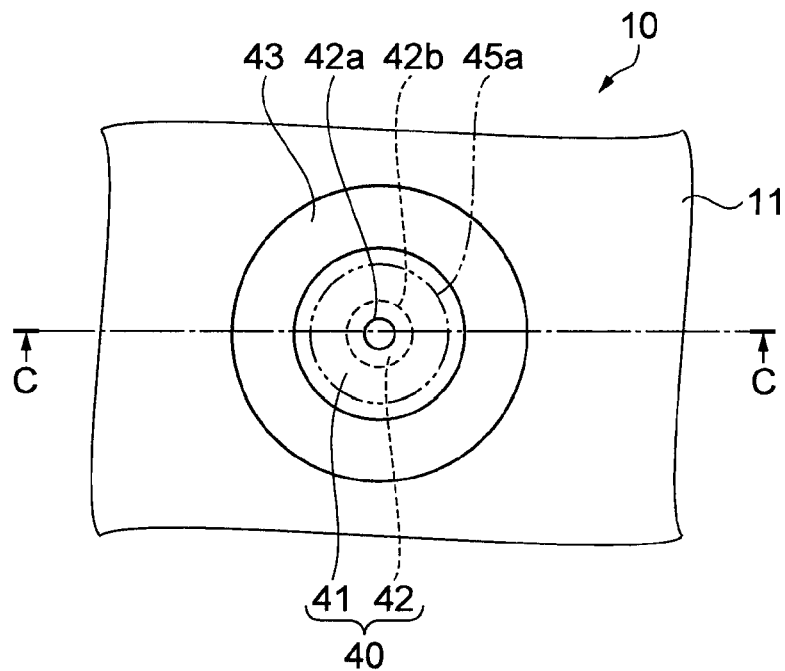
FIGS. 4A and 4B are enlarged views showing a vicinity of a sealing hole that is a D portion of the crystal resonator shown in FIG. 3.
Figure 4B:
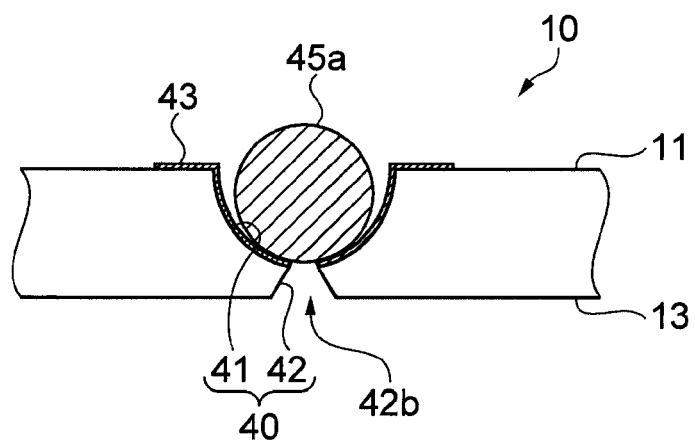

Here, a structure of the sealing hole 40, an important structure, in the crystal resonator 1 of the embodiment will be described in detail with reference to the drawings. FIGS. 4A and 4B are enlarged views showing the vicinity of the sealing hole that is a D portion of the crystal resonator shown in FIG. 3. FIG. 4A is a partial enlarged plan view, and FIG. 4B is a sectional view taken along line C-C of FIG. 4A. FIG. 4B shows the state where a solid sealant 45a is provided in the sealing hole. In FIG. 4A, the position where the sealant 45a provided in the sealing hole is indicated by a hypothetical line (two-dot chain line).

In the crystal resonator 1 according to the embodiment, the sealing hole is provided in the lid substrate 10 serving as a first substrate. In FIG. 4B, the sealing hole 40 is a through passage communicating with an exterior side surface 11 of the lid substrate 10 and the concave bottom surface of the concave 13 serving as a face at the interior space side. In the embodiment, an exterior side concave 41 and an interior space side concave 42 are in communication with each other at an opening 42a formed at the concave bottom of the exterior side concave 41. The exterior side concave 41 includes an opening at the exterior side surface 11. The opening is a hemisphere having a curved surface extending in directions of penetration and inner periphery of the sealing hole 40. The interior space side concave 42 includes an opening 42b at the interior space side.

As FIG. 4A shows, when the sealing hole 40 is plan-viewed from the exterior side toward the interior space side, the sealing hole 40 has a structure such that the area of the opening of the exterior side concave 41 is larger than the area of the openings 42a and 42b. In the embodiment, the opening of the exterior side concave 41 has the same center as the openings 42a and 42b. Further, in the sealing hole 40 according to the embodiment, the opening 42b is formed larger than the opening 42a.

In the region that can be visually recognized when the sealing hole 40 is plan-viewed from above including the interior wall of the exterior side concave 41, a metal film 43 is formed. When the sealing hole 40 is sealed, the metal and solid sealant 45a (refer to FIG. 4B) provided in the sealing hole 40 is melted. The melted metal sealant 45a wets and covers the sealing hole 40. The metal film 43 is provided to firmly seal the sealing hole 40 with the sealant 45a.

As described below, the metal film 43 of the embodiment is formed of chrome and gold sequentially laminated by sputtering, vapor deposition, or the like, and nickel, palladium, and gold sequentially laminated on the gold laminated on the chrome by electroless plating (not shown).

Further, as described below, in order to secure the adhesion between the glass substrate, a material for the lid substrate 10, and the metal film 43, the surface of the region where the metal film 43 to be formed, including the interior wall of the sealing hole 40, is processed so as to have a matte surface having predetermined roughness. In the embodiment, the interior wall of the exterior side concave 41 used for sealing the sealing hole is processed so as to have a matte surface.

According to the crystal resonator 1 of the embodiment above, since the exterior side concave 41 forming the opening at the exterior side of the sealing hole 40 provided in the lid substrate 10 is formed so as to be a hemisphere having a curved surface extending in the directions of penetration and inner periphery of the sealing hole 40, in a hole sealing step of the sealing hole 40, when the solid sealant 45a before melted is provided in the sealing hole 40, the area where the exterior surface of the sphere sealant 45a contacts with and closes with the interior wall surface of the sealing hole 40 increases. Accordingly, when the sealant 45a is melted for sealing the sealing hole 40, heat to the sealant 45a through the interior wall surface of the sealing hole 40 is well conducted, and the melted sealant 45a easily wets and covers the interior wall surface (the metal film 43) of the exterior side concave 41 of the sealing hole 40. As a result, the crystal resonator 1 can be provided that suppresses sealing defects and has stable oscillation characteristics and high reliability.

In the crystal resonator 1 according to the embodiment above, a laminated film is used as the metal film 43 provided in the region including the interior wall of the exterior side concave 41 of the sealing hole 40. The laminated layer is formed by sequentially laminating chrome and gold as a base layer, and nickel, palladium, and gold in this order on the base layer. According to the metal film 43 having such structure, the inventor confirmed that in the hole sealing step, diffusion of the metal, serving as the base layer, is suppressed and the sealing hole 40 is firmly sealed due to good wettability of the melted sealant 45*a*.

Further, in the crystal resonator 1 according to the embodiment above, the sealing hole 40 is formed that includes the exterior side concave 41 having an opening at the exterior side in communication with the interior space side concave 42 having an opening at the interior space side. According to the structure, comparing with the sealing hole formed by drilling the lid substrate 10 from either one surface thereof, the opening at the exterior side, which is where the drill is started, can be prevented from being enlarged, and the sealing hole 40 can be formed in accordance with the size of the sealant 45*a*. As a result, the hole can be stably sealed with the sealant 45*a* in the hole sealing step.

Also, in the quartz resonator 1 according to the embodiment above, the opening 42*b* is formed larger than the opening 42*a* in the sealing hole 40. Accordingly, vacuuming in the hole sealing step can be easily performed while the sealant 45*a* is prevented from dropping from the sealing hole 40. As a result, the vacuuming time is shortened, and manufacturing efficiency can be improved.

Method for Manufacturing Crystal Resonator

Figure 5:
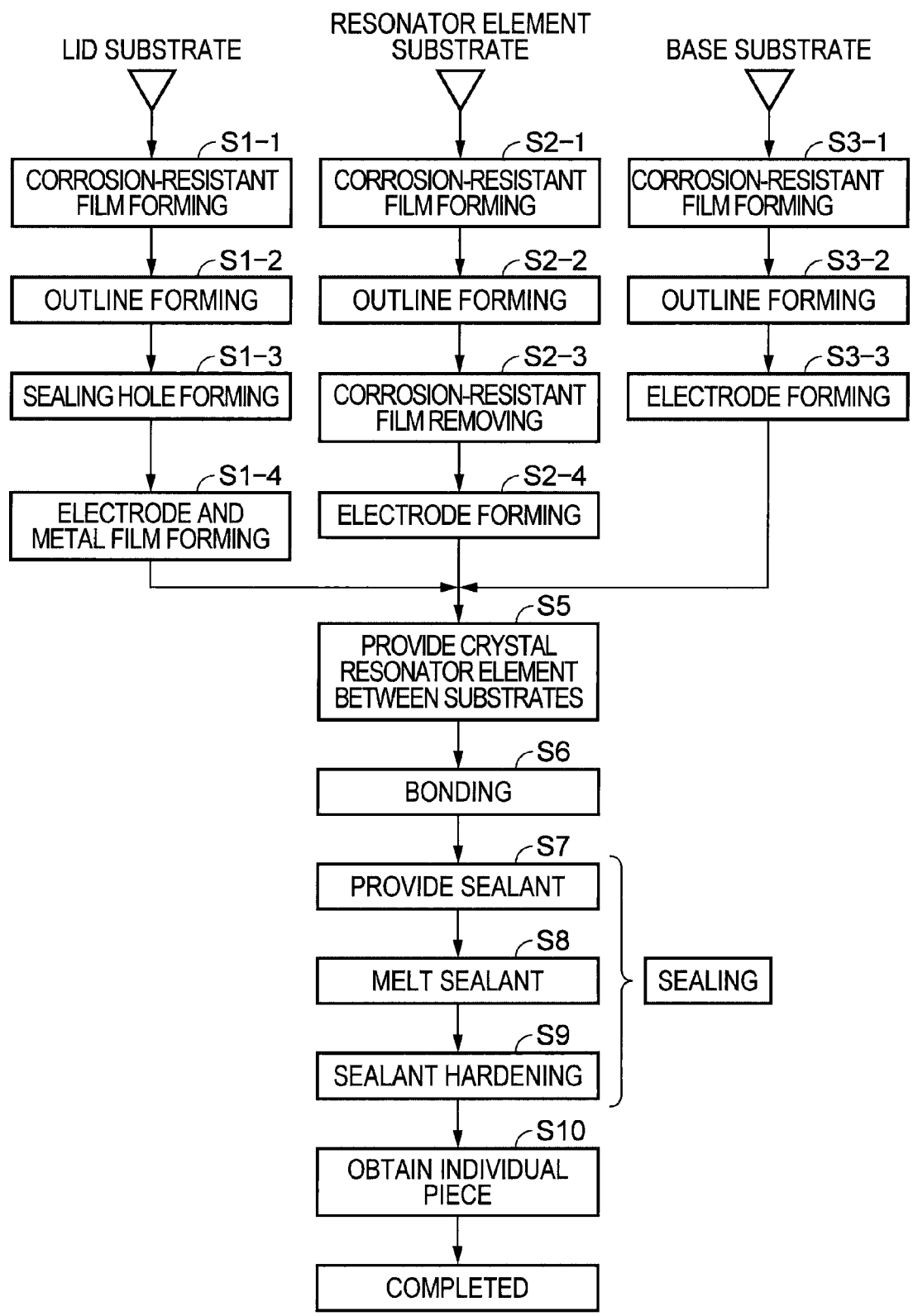
FIG. 5 is a flowchart showing a method for manufacturing a crystal resonator according to the embodiment.

A method for manufacturing the crystal resonator 1 will be explained with reference to drawings. FIG. 5 is a flowchart explaining the method for manufacturing the crystal resonator 1 according to the embodiment. In FIG. 5, the manufacturing step of the lid substrate 10 is shown in steps S1-1 to S1-4, the manufacturing step of the resonator element substrate 20 is shown in steps S2-1 to 2-4, and the manufacturing step of the base substrate 30 is shown in steps S3-1 to S3-3. These preceding steps will be explained first.

In manufacturing the crystal resonator 1 formed by direct bonding such as anodic bonding described above, the following method is employed in order to obtain a plurality of crystal resonators 1. The resonator element substrate 20, the lid substrate 10, and the base substrate 30 are arranged in multiple numbers on a large wafer and formed, respectively. After each substrate wafer is laminated and directly bonded for forming form wafer laminate, the wafer laminate is cut by dicing, breaking off, or the like, so that an individual piece forming the crystal resonator 1 is obtained.

A glass substrate (wafer) in a predetermined size is used for forming the lid substrate 10. The glass substrate is etched using photolithography so as to obtain a single or a plurality of outlines of the lid substrate 10. As a glass material used as a forming material for the lid substrate 10 and the base substrate 30 described below, a material that allows ion diffusion is selected in order to allow anodic bonding to be performed or the anodic bonding to be easily performed. For example, it is preferable to select one including alkali metal and suitable for etching, such as soda glass.

In forming the outline of the lid substrate 10, a corrosion-resistant film to be an etching mask and made of chrome (C) and gold (Au), for example, is formed entirely on both main surfaces of the glass substrate by sputtering or the like. Thereafter, photoresist is applied on the corrosion-resistant film. A mask for patterning the outline of the lid substrate 10 is arranged on the photoresist, and the photoresist is exposed. The portion exposed in the photoresist is developed and removed, and the glass substrate is soaked in an etchant. The corrosion-resistant film where the exposed photoresist is removed is etched so as to form the etching mask for forming the outline of the lid substrate 10 on the glass substrate. The etching mask is made of the corrosion-resistant film (step S-1).

The glass substrate in which the etching mask is formed is dipped in an etchant, such as hydrogen fluoride solution. By etching the glass substrate until the portion corresponding to the outline of the lid substrate 10 is penetrated, the outline of the lid substrate 10 is formed (step S1-2). Here, the outline of the lid substrate 10 is connected to the glass substrate (in a wafer state) with perforations not to be completely separated therefrom, for example. Accordingly, since the glass substrate is in the wafer state, steps hereinafter can be efficiently performed.

As step S1-3 shows, the sealing hole is formed. In the embodiment, the sealing hole 40 (refer to FIG. 4) is formed by sandblasting. The sealing hole 40 includes the exterior side concave 41 and the interior space side concave 42 in communication with each other at the opening 42*a* formed at the concave bottom of the exterior side concave 41. The exterior side concave 41 includes the opening at the exterior side surface 11. The opening is a hemisphere having a curved surface extending in the directions of penetration and inner periphery of the sealing hole 40. The interior space side concave 42 includes the opening 42*b* at the interior space side. The sandblasting is a method for forming holes, concaves, and the like in a desired shape by quantitatively spraying fine abrasives onto the process portion of the workpiece. The sandblasting has an excellent control of the etch profile comparing with an etching method, such as wet etching or dry etching. The sandblasting is particularly suitable for forming concaves and holes in a hemisphere (a semicircular-arc in cross-section).

By using the sandblasting, the exterior side concave 41 and the interior space side concave 42 are formed. The exterior side concave 41 is formed by drilling the lid substrate 10 from the exterior side surface of the lid substrate 10 in a thickness direction thereof. On the other hand, the interior space side concave 42 is formed by drilling the lid substrate 10 from the interior space side surface of the lid substrate 10 in the thickness direction thereof. In this way, the exterior side concave 41 and the interior space side concave 42 are communicated, so that the sealing hole 40 communicating with the exterior side and the interior space side of the lid substrate 10 is formed.

To be specific, a photosensitive masking film is bonded on the glass substrate in which the outline of the lid substrate 10 is formed. A patterning mask having the opening shape of the exterior side concave 41 or the interior space side concave 42 is aligned with the masking film, and the pattern of the opening shape is exposed. Then, development is performed that removes the exposed portion of the masking film so as to form a mask for sandblasting. Thereafter, abrasives are sprayed with the mask for sandblasting as a mask from the spray nozzle of the sandblasting device so as to physically etch the non-masked portion of the glass substrate. At this time, the spray position of the abrasives from the spray nozzle is moved while spray pressure of the abrasives, spray time, and the like are adjusted so as to form the exterior side concave 41 in a hemisphere and the interior space side concave 42. Accordingly, the sealing hole 40 is formed that includes two concaves, the exterior side concave 41 and the interior side concave 42 in communication with each other at their concave bottom. Here, since the solid sealant 45*a* before melted (refer to FIG. 4) is provided in the exterior side concave 41 in the hole sealing step described below, the exterior side concave 41 is necessary to be a hemisphere (semicircular-arc in cross-section). The shape of the interior space side concave 42 may not be a hemisphere.

Here, what is as important as forming the exterior side concave 41 in a hemisphere is, as described below, in forming the metal film 43, in order to secure the adhesion between the glass substrate and the metal film 43, the surface of the region where the metal film 43 to be formed, including the interior wall of the sealing hole 40, is processed so as to have a matte surface having predetermined roughness. In the embodiment, at least the interior wall of the exterior side concave 41 used for sealing the hole is processed so as to have a matte surface having predetermined roughness. In order to make the surface of the interior wall of the exterior side concave 41 having predetermined roughness, it can be realized by selecting and adjusting types and roughness of abrasives in forming the sealing hole by the sandblasting described above.

As step 1-4 shows, the metal film 43 is formed on the lid substrate 10 (refer to FIG. 4). In the embodiment, the metal film 43 is formed by employing both vapor phase deposition, such as sputtering or vapor deposition, and electroless plating.

First, chrome and gold are sequentially laminated in this order by sputtering, vapor deposition, or the like. The metal film that chrome and gold are laminated is patterned by photolithography so as to form a pattern of the metal film 43. Then, nickel, palladium, and gold are sequentially laminated in this order on the pattern of the metal film 43 by electroless plating, so that the metal film 43 is formed. As described above, the lid substrate 10 is completed.

A method for manufacturing the resonator element substrate 20 will be described. In manufacturing the resonator element substrate 20, a large quartz crystal substrate (quartz crystal wafer) is prepared. The quartz crystal substrate is cut out at a predetermined cut angle with respect to the crystal axis, and is polished into a desired thickness and a surface condition. Then, as step S2-1 shows, a plurality of outlines of the resonator element substrate 20 is formed in the quartz crystal substrate by wet etching using photolithography.

To be specific, as shown in step S 2-1, a corrosion-resistant film to be an etching mask and made of chrome and gold, for example, is formed entirely on both main surfaces of the quartz crystal substrate by sputtering or the like. Thereafter, photoresist is applied on the corrosion-resistant film. A mask for patterning the outline of the resonator element substrate 20 is arranged on the photoresist so as to expose the outline pattern. The portion exposed in the photoresist is developed and removed, and the quartz crystal substrate is soaked in an etchant. The corrosion-resistant film where the exposed photoresist is removed is etched so as to form an etching mask for forming the outline of the resonator substrate 20 on the quartz crystal substrate. The etching mask is made of the corrosion-resistant film.

As shown in step S2-2, the quartz crystal substrate in which the etching mask is formed is soaked in an etchant, such as hydrogen fluoride solution and ammonium fluoride solution. By etching the quartz crystal substrate until the portion corresponding to the outline of the resonator element substrate 20 is penetrated, the outline of the resonator element substrate 20 is formed. Here, the outline of the resonator element substrate 20 is connected to the quartz crystal substrate with perforations not to be completely separated therefrom. Accordingly, since the quartz crystal substrate is in a wafer state, steps hereinafter can be efficiently performed.

As shown in step S2-3, the etching mask made of the corrosion-resistant film for forming the outline of the resonator element substrate 20 is removed.

As shown in step S2-4, the electrodes, such as the first electrode 28 including the first bonding electrode 28a and the first excitation electrode 26B and the second electrode 29 including the second bonding electrode 29a and the second excitation electrode 26A, are formed by sputtering, vapor deposition, or the like. The electrodes are formed as follows. A chrome layer as a base is formed by sputtering or vapor deposition on the surface of the quartz crystal substrate in which the outline of the resonator element substrate 20 is formed. A metal layer is laminated thereon. Further, on the portions of the metal layer corresponding to the first and the second bonding electrodes 28a and 29a, an aluminum layer, for example, is laminated as a metal coated layer for anodic oxidation. Instead of aluminum, for example, tungsten, nickel, titanium, or silicon may be used.

A method for manufacturing the base substrate 30 will be described. The base substrate 30 can be formed of the same glass material and basically by the same method as the lid substrate 10 above. At first, a corrosion-resistant film to be an etching mask and made of chrome and gold, for example, is formed by sputtering or the like entirely on both main surfaces of the glass substrate made of soda glass or the like, for example. Thereafter, the glass substrate is etched by photolithography so as to form an etching mask for the outline of the base substrate 30 made of the corrosion-resistant film (step S3-1).

As shown in step S3-2, the glass substrate in which the etching mask is formed is soaked in an etchant, such as hydrogen fluoride solution, for example. By etching the glass substrate until the portion corresponding to the outline of the base substrate 30 is penetrated, the outline of the base substrate 30 is formed.

As shown in step S3-3, the electrodes, such as the mounting electrodes 35 and 36 and the side electrode 35a serving as a laid out wiring, are formed as follows. Chrome and gold are sequentially laminated in this order on the base substrate 30 by sputtering, vapor deposition, or the like. Then, the base substrate 30 is patterned by photolithography so as to form the electrodes. As described above, the base substrate 30 is completed.

The post steps will be explained. In the embodiment, the lid substrate 10, the base substrate 30, and the resonator substrate 20 manufactured by the method above are anodically bonded as described above with reference to FIG. 3. The anodic bonding is one of a direct bonding method. First, as step S5 shows, the resonator element substrate 20 with which the crystal resonator element 25 is integrally formed is provided between the lid substrate 10 and the base substrate 30. At this time, the first and the second bonding electrodes 28a and 29a, serving as a bonding film for the anodic bonding, are aligned.

As step S6 shows, the resonator element substrate 20 is anodically bonded between the lid substrate 10 and the base substrate 30 by applying a direct current voltage from the direct current power source 49 between the first and the second bonding electrodes 28a and 29a such that the first and the second bonding electrodes 28a and 29a function as an anode. The anodic bonding can be performed in atmospheric pressure unlike a related art bonding process in which degassing from the interior space S1 is required.

The substrate (wafer) laminate bonded by anodic bonding is sealed in a sealing step below. That is, as step S7 shows, the solid and sphere sealant 45a is provided in the sealing hole 40 of the lid substrate 10 of the substrate laminate. At this time, as FIG. 4B shows, the sphere sealant 45a is provided such that many portions thereof contacts with or close to the exterior side concave 41 in a hemisphere opening at the exterior side of the lid substrate 10. The sealant 45a preferably has a higher melting point than a reflow temperature at which the completed the crystal resonator 1 is mounted on an external mounting substrate. For example, an alloy of gold and tin (Sn), an alloy of gold and germanium (Ge), or the like are used for the sealant 45*a*.

The substrate laminate is housed in a vacuum chamber, and inside thereof is depressurized to a predetermined degree of vacuum. Gas from the inside of the crystal resonator element 25, the lid substrate 10, and the base substrate 30 is emitted from the sealing hole 40. Then, the solid sealant 45*a* is irradiated with an electron beam or a laser so as to melt the solid sealant 45*a* (step S8). The melted sealant 45 (refer to FIG. 3) wets and covers the surface of the metal film 43 formed on the interior wall of the sealing hole 40. The melted sealant 45 is filled so as to cover the sealing hole. The temperature of the vacuum chamber is decreased until the sealant 45 becomes completely solidified so as to harden the sealant (step S9). Then, the substrate (wafer) laminate that the hole therein is sealed is taken out from the vacuum chamber.

As step S10 shows, the substrate (wafer) laminate that the hole therein is sealed is diced or the like so as to obtain an individual piece of the crystal resonator 1. After the necessary inspection and the like are performed, the crystal resonator 1 is completed.

In the manufacturing method above, the sandblasting is used for forming the sealing hole 40 including the exterior side concave 41 and interior space side concave 42. Unlike etching method, such as wet etching or dry etching, the sandblasting does not rely on the anisotropy of the workpiece. Thus, the substrate can be drilled to a predetermined shape. Accordingly, the sandblasting is preferable to form the exterior side concave 41 in a hemisphere as the embodiment above, and the sealing hole 40 stably sealed by the sphere sealant 45*a* can be formed.

Additionally, in the manufacturing method above, the sealing hole 40 is formed that includes the exterior side concave 41 and the interior space side concave 42 in communication with each other at the opening 42*a* formed at the concave bottom of the exterior side concave 41 by going through the step of forming the exterior side concave 41 and the step of forming the interior space side concave 42. The exterior side concave 41 is formed by drilling the lid substrate 10 from the exterior side surface of the lid substrate 10 in the thickness direction thereof while the interior space side concave 42 is formed by drilling the lid substrate 10 from the interior space side surface, facing the external side surface, of the lid substrate 10 in the thickness direction thereof.

According to the structure, comparing with the sealing hole formed by drilling or etching the lid substrate from either one surface thereof, the shape of the opening at the side where the drill is started can be prevented from being enlarged, and the sealing hole can be formed in accordance with the size of the sealant 45*a*. Accordingly, the hole can be firmly sealed with the sealant 45, and the crystal resonator 1 having stable oscillation characteristics can be manufactured.

Further, the manufacturing method above includes the step of forming the metal film 43 in the region including the interior wall surface of the exterior side concave 41 of the sealing hole 40. Therefore, the melted sealant 45*a* made of metal wets and covers the metal film 43. This allows the hole to be firmly sealed.

It is understood that the invention is not limited to the embodiment described above, and the following modifications can be made.

First Modification

Figure 6A:
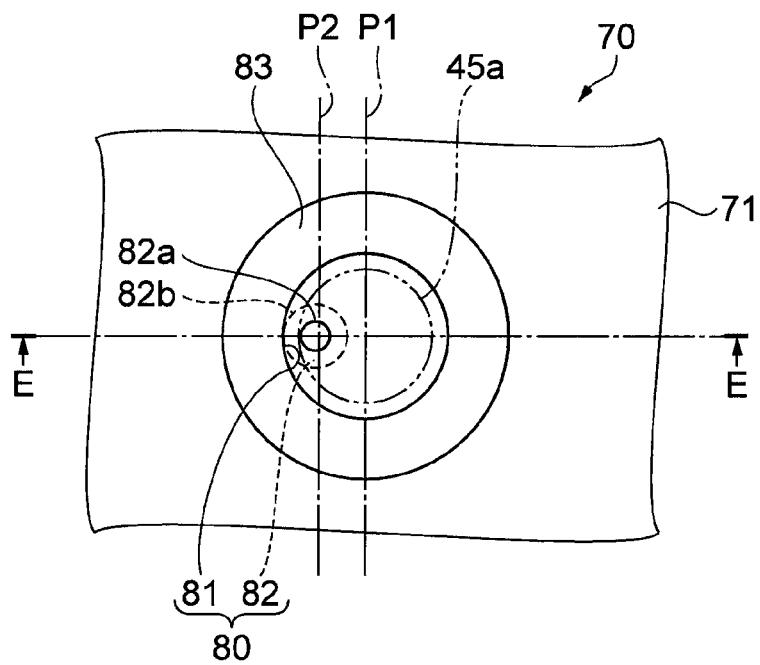
FIGS. 6A and 6B show a first modification.
Figure 6B:
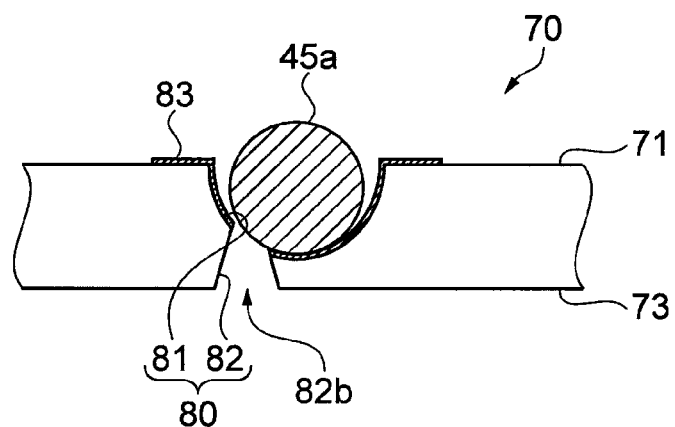

In the embodiment above, the center of the opening at the exterior side is the same as the center of the openings 42*a* and 42*b* at the interior space side in the sealing hole 40 that includes the exterior side concave 41 and the interior space side concave 42 in communication with each other at the opening 42*a* formed at the concave bottom of the exterior side concave 41. The exterior side concave 42 is a hemisphere including the opening at the exterior side surface 11 of the lid substrate 10. The interior space side concave 42 includes the opening 42*b* at the interior space side. Not only the structure above, but also the structure can be employed that the center of the opening of the exterior side concave is off-center from the center of the opening of the interior space side concave. This makes it possible to increase efficiency in vacuuming in the hole sealing step. FIGS. 6A and 6B are schematic views showing the modification of sealing the hole in the lid substrate. FIG. 6A is a partial plan view of the lid substrate when viewed from the exterior side. FIG. 6B is a partial sectional view taken along line E-E of FIG. 6A. Here, for convenience of the description, FIGS. 6A and 6B show the state where the sphere sealant 45*a* before melted is provided in a sealing hole 80.

Referring to FIGS. 6A and 6B, the sealing hole 80 is formed in substantially the center of a lid substrate 70 made of glass or the like. The sealing hole 80 includes an exterior side concave 81 and an interior space side concave 82 in communication with each other at a middle opening 82*a* that is the middle of the lid substrate 70 in a thickness direction thereof. The exterior side concave 81 is a hemisphere widely opening at an exterior side surface 71 while the interior space side concave 82 includes an interior space side opening 82*b* widely opening at an interior space side surface 73.

According to the modification, the opening of the exterior side concave 81 of the sealing hole 80 is a circle when the opening is plan-viewed. The interior space side opening 82*b* also is a circle when the opening is plan-viewed. In the drawing, the center of the exterior side concave 81, indicated by line E-E and a center line P1, is different from the center of the interior space side concave 82, indicated by the intersection of line E-E and a center line P2 when the concaves are plan-viewed. The center lines P1 and P2 are orthogonal to line E-E. In addition, a metal film 83 is formed in the region including the exterior side concave 81 of the sealing hole 80.

According to the structure of the lid substrate 70 of the first modification above, when the sphere sealant 45*a* before melted is provided in the sealing hole 80, the middle opening 82*a*, serving as a communication portion between the exterior side concave 81 and the interior space side concave 82, is off-center from the center of the exterior side concave 81. Therefore, a relatively large space is ensured between the interior wall of the exterior side concave 81 and the sealant 45*a*. As a result, the vacuuming time in the hole sealing step can be further shortened.

Second Modification

Figure 7A:
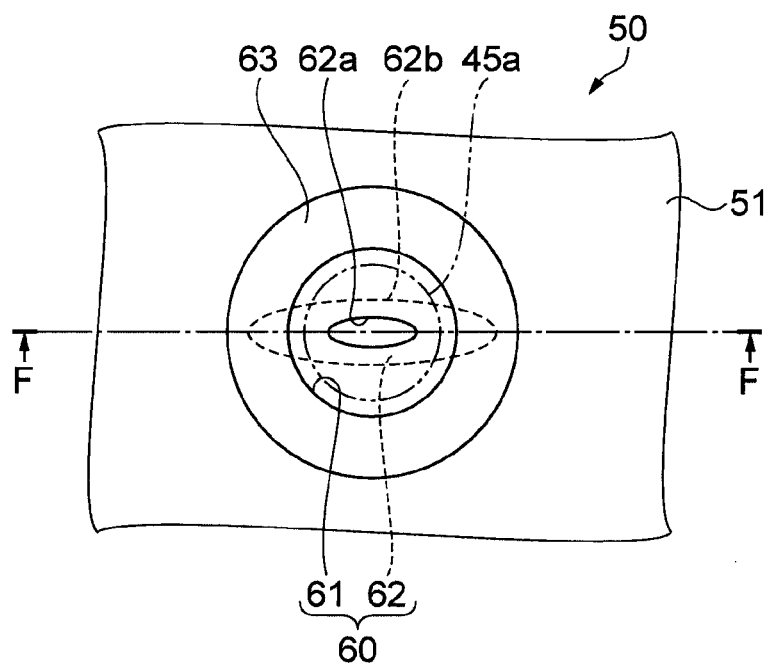
FIGS. 7A and 7B show a second modification.
Figure 7B:
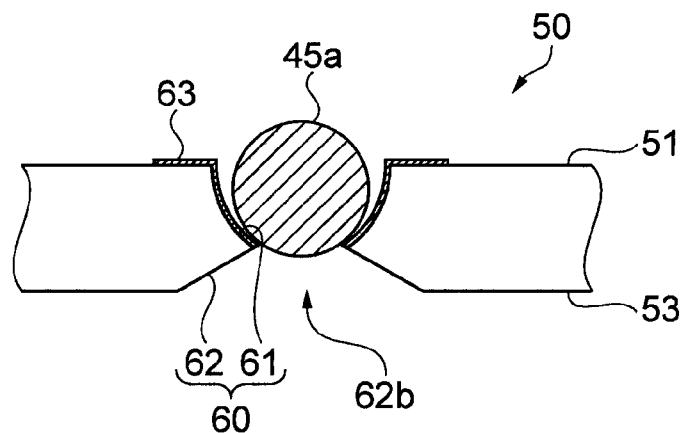

In the sealing holes 40 and 80 of the lid substrates 10 and 70 according to the embodiment and the first modification above, the exterior side concaves 41 and 81 and the interior space side concaves 42 and 82 in communication with each other are a circle when the sealing holes are plan-viewed. Not only the structure above, but also a structure can be employed that the upper side and the bottom side openings of the interior space side concave are an oval when the openings are plan-viewed. This makes it possible to increase efficiency in vacuuming in the hole sealing step. FIGS. 7A and 7B are schematic views showing the second modification of sealing the hole in the lid substrate. FIG. 7A is a partial plan view of the lid substrate when viewed from the exterior side. FIG. 7B is a partial sectional view taken along line F-F of FIG. 7A. Here, for convenience of the description, FIGS. 7A and 7B show the state where the sphere sealant 45a before melted is provided in a sealing hole 60.

Referring to FIGS. 7A and 7B, the sealing hole 60 is formed in substantially the center of a lid substrate 50 made of glass or the like. The sealing hole 60 includes an exterior side concave 61 and an interior space side concave 62 in communication with each other at a middle opening 62a that is the middle of the lid substrate 50 in a thickness direction thereof. The exterior side concave 61 is a hemisphere widely opening at an exterior side surface 51 while the interior space side concave 62 includes an interior space side opening 62b widely opening at an interior space side surface 53.

According to the modification, the exterior side concave 61, a concave in a hemisphere, of the sealing hole 60 is almost a circle when viewed from above. On the other hand, the interior space side concave 62 is an oval when viewed from above. In addition, a metal film 63 is formed in the region including the exterior side concave 61 of the sealing hole 60.

According to the structure of the lid substrate 50 of the second modification above, the middle opening 62a and the interior space side opening 62b are almost an oval when viewed from above. The middle opening 62a is the upper side opening of the interior space side concave 62 while the interior space side opening 62b is the bottom side opening thereof. Accordingly, in the sealing step of the sealing hole 60, when the sphere sealant 45a is provided in the exterior side concave 61 of the sealing hole 60, a larger space is ensured between the interior wall of the sealing hole 60 and the sealant 45a comparing with the middle opening in a circle because of the middle opening 62a in an oval provided at the bottom surface of the exterior side concave 61. In regard to the interior space side concave 62, the interior space side opening 62b is formed larger than the middle opening 62a. Accordingly, the vacuuming can be easily performed in the hole sealing step. As a result, the vacuuming time can be further shortened and the manufacturing efficiency is enhanced.

Third Modification

Figure 8A:
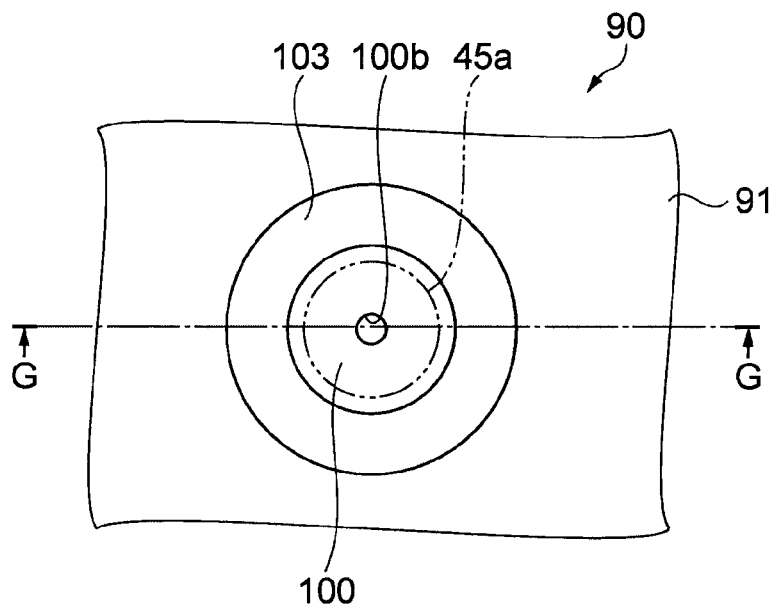
FIGS. 8A and 8B show a second modification.
Figure 8B:
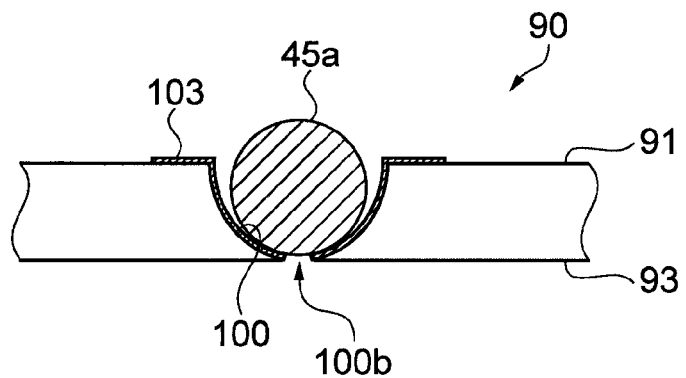

According to the embodiment, the first modification, and the second modification above, two concaves, the exterior side concaves 41, 61, and 81 and the interior space side concaves 42, 62, and 82, are in communication with each other so as to form the sealing holes 40, 60, and 80 of the lid substrates 10, 50, and 70. The exterior side concaves 41, 61, and 81 are formed by drilling the lid substrates 10, 50, and 70 from the exterior surfaces thereof. The interior space side concaves 42, 62, and 82 are formed by drilling the lid substrates 10, 50, and 70 from the interior space side surfaces thereof. Not only the structure above, the sealing hole may be formed by drilling the substrate only from the exterior side surface the substrate to the interior space side surface so as to penetrate therethrough. FIGS. 8A and 8B are schematic views showing the third modification of sealing the hole in the lid substrate. FIG. 8A is a partial plan view of the lid substrate when viewed from the exterior side. FIG. 8B is a partial sectional view taken along line G-G of FIG. 8A. Here, for convenience of the description, FIGS. 8A and 8B show the state where the sphere sealant 45a before melted is provided in a sealing hole 100.

Referring to FIGS. 8A and 8B, the sealing hole 100 is formed in substantially the center of a lid substrate 90 made of glass or the like. The sealing hole 100 is a concave in a hemisphere widely opening at an exterior side surface 91. The sealing hole 100 includes an interior space side opening 100b that is a portion of the bottom surface of the sealing hole 100 reaches to an interior space side surface 93. In addition, a metal film 103 is formed in the region including the interior wall of the sealing hole 100.

According to the structure of the sealing hole 100 above, the sealing hole 100 is a hemisphere widely opening at the outer surface side 91 of the lid substrate 90. Thus, when the sphere sealant 45a before melted is provided in the sealing hole 100 in the sealing step, the area where the exterior surface of the sealant 45a contacts with or close to the interior wall surface of the sealing hole 100 increases. Accordingly, when the sealant 45a is melted, heat to the sealant 45a through the interior wall surface of the sealing hole 100 is well conducted, and sealing defects are suppressed. As a result, the crystal resonator having stable oscillation characteristics and high reliability can be provided.

Fourth Modification

Figure 9A:
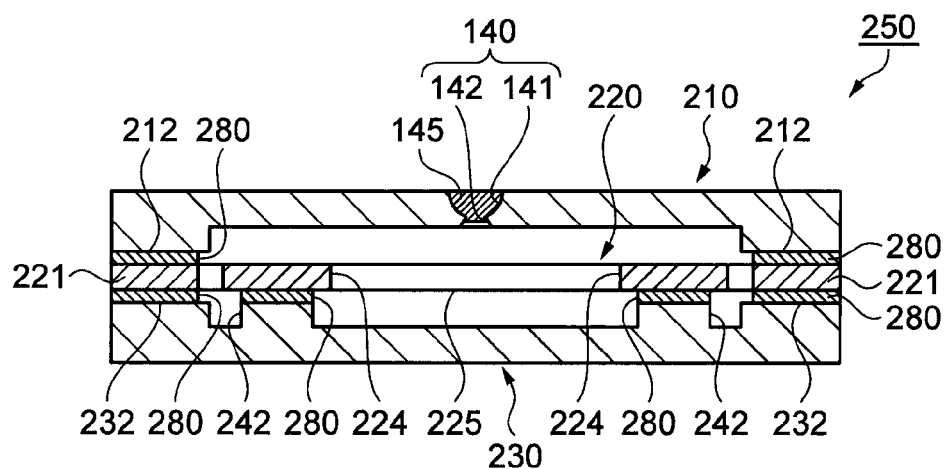
FIG. 9A is a schematic view showing a pressure sensor as a modification of a piezoelectric device.
Figure 9B:
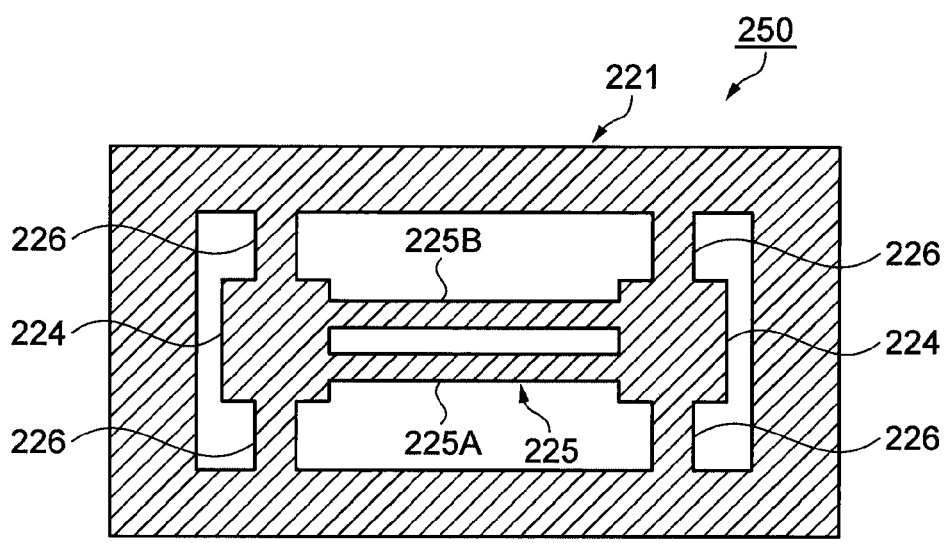
FIG. 9B is a plain view schematically showing a sensor element of the pressure sensor.

According to the embodiment and the first to the third modifications above, as an example of piezoelectric device that allows a hole having a hemisphere interior wall provided in a lid substrate to be firmly sealed by using the hole, the crystal resonator 1 is described. The crystal resonator 1 employs a tuning fork type crystal resonator element as an electronic component. The sealing hole having the structures described above also provides the same effects in a pressure sensor serving as a piezoelectric device in which a double-ended tuning fork type crystal resonator element serving as an electronic component is firmly sealed and housed. FIGS. 9A and 9B are schematic views showing the pressure sensor as a modification of the piezoelectric device. FIG. 9A is a sectional view, and FIG. 9B is a plain view schematically showing a sensor element serving as an electronic component that is a main portion of the pressure sensor.

Referring to FIG. 9B, a pressure sensor 250 includes a first diaphragm 230 serving as a first substrate and a first substrate 210 serving as a second substrate. The pressure sensor 250 is a so-called diaphragm type pressure sensor that a resonating portion 225 of a sensor element 220 is airtightly sealed in an interior space formed in the first diaphragm 230 and the first substrate 210.

As FIG. 9A shows, in the pressure sensor 250, each face of the first diaphragm 230 and the first substrate 210 facing to each other includes a concave. The bottom surface of the concave serves as a pressure receiver, and a portion forming the side wall of the concave serves as a support. That is, the portion forming the side wall of the first diaphragm 230 is a support 232 while the portion forming the side wall of the first substrate 210 is a support 212. The supports 232 and 212 are provided so as to surround the periphery of the pressure receiver.

The supports 232 and 212 serve as a bonding position when the first diaphragm 230 and the first substrate 210 are bonded with the sensor element 220 therebetween. The concaves of the first diaphragm 230 and the first substrate 210 form the interior space therebetween. Each pressure receiver of the first diaphragm 230 and the first substrate 210 is bent by a pressure difference applied to the face at the exterior side and the face at the interior space side. The face at the exterior side receives pressure to be measured.

The face at the interior space side of the first diaphragm 230 includes a fixing portion 242, serving as a concave, at the position corresponding to bases 224 of the sensor element 220 described below. The fixing portion 242 includes a pair of fixing portions so as to support both ends (the bases 224) of the sensor element 220. The fixing portions 242 are provided such that the center thereof is positioned at the center of the pressure receiver.

As FIG. 9B shows, the sensor element 220 according to the modification is a double-ended tuning fork type resonator element in a frame shape. That is, the sensor element 220 is made of quartz crystal material, and includes the resonating portion 225 and a frame 221. The resonating portion 225 includes resonating arms 225A and 225B extending in parallel, and the bases 224 positioning at both ends of the resonating arms 225A and 225B. The frame 221 is provided at the periphery of the resonating portion 225. The long sides, along the resonating arms 225A and 226B, and the bases 224, at both ends of the long sides of the resonating portion 225, are connected with connecting portions 226.

Each of the resonating arms 225A and 225B includes an excitation electrode (not shown), and the base 224 includes a mounting electrode coupled to the excitation electrode through a connecting pattern (not shown). The excitation electrode includes a pair of excitation electrodes and the mounting electrode corresponding to the excitation electrode includes a pair of mounting electrodes so that they each have positive and negative polarities. When an electrical signal (driving signal) is supplied to the sensor element 220, the driving signal is supplied to the excitation electrode through the mounting electrode and the connecting pattern to perform a flexure vibration in which two resonating arms 225A and 225B come close to and away from each other by the piezoelectric action that the quartz crystal material has.

In the pressure sensor 250 shown in FIG. 9A, the first diaphragm 230 and the first substrate 210 are bonded with the sensor element 220 therebetween. That is, the support 232 of the first diaphragm 230 and the support 212 of the first substrate 210 are bonded to the frame 221 of the sensor element 220 by a bonding medium 280. Additionally, the base 224 of the sensor element 220 is bonded to the fixing portion 242 of the first diaphragm 230 by the bonding medium 280. Accordingly, the resonator portion 225, including resonating arms 225A and 225B, of the sensor element 220 are fixed and supported by two fixing portions 242 of the first diaphragm 230 at both end thereof.

In the laminate above, a sealing hole 140 is, for example, provided in the first substrate 210 in the modification. The first substrate 210 is different from the first diaphragm and does not bend as pressure is applied. The sealing hole 140 is used in the sealing step in which the resonating portion 225 of the sensor element 220 is airtightly sealed in the interior space formed inside of the first diaphragm 230 and the first substrate 210. The sealing hole 140 of the modification has the same structure as that of the sealing hole 40 provided in the lid substrate 10 according to the embodiment above (refer to FIG. 4). That is, the sealing hole 140 is a through passage communicating with the exterior side and the interior space side of the first substrate 210. The sealing hole 140 includes an exterior side concave 141 and an interior space side concave 142 that are in communication with each other at an opening formed at the concave bottom of the exterior side concave 141. The exterior side concave 141 includes an opening at the exterior side surface. The opening is a hemisphere having a curved surface extending in the directions of penetration and inner periphery of the sealing hole 140. The interior space side concave 142 includes an opening at the interior space side. Further, the metal film (not shown) is formed in the region that can be visually recognized when the sealing hole 140 is viewed from above including the interior wall of the exterior side concave 141.

A sealant 145 is provided in the sealing hole 140, so that the resonating portion 225 is airtightly sealed in the interior space of the pressure sensor 250. When the interior space is an absolute vacuum, it is possible to measure absolute pressure.

That is, when external pressure is applied and the first diaphragm 230 is bent, deflection force travels in the resonating arms 225A and 225B of the crystal resonator element of the double-ended tuning fork type. The traveled deflection force serves as compression force or contraction force to the resonating arms 225A and 225B, thereby a frequency of the crystal resonator element varies. Based on the varied frequency, it is possible to measure a pressure value.

According to the pressure sensor 250 above, since the exterior side concave 141 of the sealing hole 140 provided in the first substrate 210 is a hemisphere, when the sphere and solid sealant 145 provided in the sealing hole 140 in the sealing step is melted, heat to the sealant 145 through the interior wall surface of the sealing hole 140 is well conducted, and the melted sealant 145 easily wets and covers the interior wall surface (the metal film) of the exterior side concave 141. Therefore, it is possible to firmly and airtightly seal the resonating portion 225 of the sensor element 220 in the interior space formed by the first diaphragm 230 and the first substrate 210. Since the interior space can be an absolute vacuum and oscillation characteristics of the resonating portion 225 can be stabilized, the pressure sensor 250 having high precision can be provided. The first substrate 210, different from the first diaphragm 230 and does not bend as pressure is applied, is hard to be bent by pressure comparing with the first diaphragm 230. In force sensors such as a pressure sensor including the sealing hole 140 in the first substrate 210, when pressure is applied, a large distortion hardly occurs at the bonding interface between the sealing hole 140 and the sealant 145. Thus, maintenance of high reliability in the airtightly sealing function can be expected.

The embodiment and its modifications of the invention are hereinbefore described. However, the invention is not limited to the embodiment and its modifications but may be further modified within the scope of the invention.

For example, in the embodiment and the fourth modification above, the example is described in which the piezoelectric resonator element is used as an electronic component. To be specific, the crystal resonator element made of quartz crystal material, especially, the tuning fork type crystal resonator element 25 and the sensor element 220 including the double-ended tuning fork type crystal resonator, are described. The crystal resonator element may be quartz resonator elements in a flat shape having cutting angles, such as an AT cut angle. Not only the crystal resonator element made of quartz crystal, but also a piezoelectric resonator element made of other piezoelectric materials can be used. For example, a lithium tantalate substrate, a lithium niobate substrate, or the like may be employed. Additionally, in the embodiment above, a glass substrate, such as blue glass, is used as a material for the lid substrate 10 and the base substrate 30, however, other materials allowing direct bonding can be used as well. Examples of other materials include silicon or a quartz crystal same as the resonator element substrate 20, or the like.

Further, in the embodiment and the modifications above, the crystal resonator 1 and the pressure sensor 240, serving as a piezoelectric device, and the crystal resonator element 25, the sensor element 220, and the like, serving as a piezoelectric resonator element as electronic components included in the piezo electric device, are described. A device of which other electronic components of the piezoelectric resonator element are airtightly sealed in the interior space formed by the first substrate and the second substrate also can provide an electronic device having the same effects as the sealing holes 40, 60, 80, 100, and 140 described in the embodiment and the modifications above.

In the embodiment above, although the base substrate 30 and the lid substrate 10 are anodically bonded to the resonator element substrate 20, other direct bonding methods may be employed. For example, a direct bonding method may also be used in which bonding regions that are a corresponding surface for bonding of quartz crystal or glass mainly composed of silicon (Si) are mirror polished, brought into contact, and pressurized so as to directly bond the bonding materials by silicon bonds (interatomic bonds) of the contact surface (also called surface activated bonding). Further, a direct bonding method may be used in which a bonding material, such as low-melting point glass, is heated and pressurized. Furthermore, a direct bonding method may be used in which hydroxyl groups on a surface of one bonding material is directly hydrogen bonded to oxygen atoms on a surface of the other bonding material. In the method, after cleaning the bonding materials, water molecules are sprayed onto the materials in a vacuum atmosphere so as to adsorb and activate water molecules and hydroxyl groups (OH groups) on the surfaces of the bonding materials. Then, the water molecules on the surfaces are removed by plasma irradiation and then the surface of the bonding materials are closely made contact with each other. According to the bonding method using hydrogen bonding, the bonding materials are directly bonded by only bringing them into contact with each other.

In the embodiment above, the interior space S1 of the crystal resonator 1 is vacuumed and sealed by performing the hole sealing step in the vacuum chamber. The sealing step may be performed after inert gas, such as nitrogen, helium, or argon, is filled in the interior space.

In the embodiment above, as the metal film 43 formed in the sealing hole 40, chrome and gold are sequentially laminated as a base layer, and nickel, palladium, and gold are sequentially laminated in this order on the base layer. Thus, especially good wettability of the sealant can be obtained when the sealant 45a is melted so as to fill the sealing hole 40. As long as one can ensure good wettability and the like, the metal film 43 may be an alloy layer formed of a part of metal materials above or a single layer formed of a signal metal material above. Alternatively, other metal materials may be used for the metal film 43.

The entire disclosure of Japanese Patent Application Nos. 2008-274040 filed Oct. 24, 2008 and 2009-120593, filed May 19, 2009 are expressly incorporated by reference herein.

What is claimed is:

1. A package for an electronic component, comprising:
a first substrate;
a second substrate coupled to the first substrate so as to form an interior space capable of housing the electronic component between the first and second substrates;
a sealing hole communicating with the interior space and an exterior space formed in at least one of the first substrate and the second substrate, the interior space is airtightly sealable by melting a solid sealant provided in the sealing hole; and
an interior wall of the sealing hole has a curved surface extending in a penetration direction and an inner periphery direction of the sealing hole so that the interior wall has a hemispherical shape,
wherein a base circumference of the hemispherical shaped interior wall faces toward the exterior space.

2. A package for an electronic component, comprising:
a first substrate;
a second substrate coupled to the first substrate so as to form, an interior space capable of housing the electronic component between the first and second substrates;
a sealing hole communicating with the interior space and an exterior space formed in at least one of the first substrate and the second substrate, the interior space is airtightly sealable by providing a sealant in the sealing, hole; and
an interior wall of the sealing hole has a curved surface extending in a penetration direction and an inner periphery direction of the sealing hole so that the interior wall has a hemispherical shape,
wherein the sealing hole has a first opening at an exterior space side of the sealing hole and a second opening at an interior space side of the sealing hole when the sealing hole is plan-viewed from the exterior space toward the interior space, an area of the first opening is greater than an area of the second opening, and a center of the first opening is different from a center of the second opening.

3. A piezoelectric device, comprising:
a piezoelectric resonator element;
a first substrate;
a second substrate coupled to the first substrate so as to form an interior space capable of housing the piezoelectric resonator element between the first and second substrates;
a sealing hole communicating with the interior space and an exterior space formed in at least one of the first substrate and the second substrate; and
a solid sealant provided in the sealing hole by being melted and solidified so as to airtightly seal the interior space,
wherein an interior wall of the sealing hole has a curved surface extending in a penetration direction and an inner periphery direction of the sealing hole so that the interior wall has a hemispherical shape, and
the sealing hole has a first opening at an exterior space side of the sealing hole and a second opening at an interior space side of the sealing hole when the sealing hole is plan-viewed from the exterior space toward the interior space, and an area of the first opening is greater than an area of the second opening.

4. The piezoelectric device according to claim 3, wherein the second opening of the sealing hole at the interior space side is an oval if the opening is plan-viewed.

5. The piezoelectric device according to claim 3, wherein a center of the first opening at the exterior side of the sealing hole is different from a center of the second opening at the interior space side.

* * * * *